(12) United States Patent
Western et al.

(10) Patent No.: US 9,615,452 B1
(45) Date of Patent: Apr. 4, 2017

(54) SILVER FILLED TRENCH SUBSTRATE FOR HIGH POWER AND/OR HIGH TEMPERATURE ELECTRONICS

(71) Applicant: Arkansas Power Electronics International, Inc., Fayetteville, AR (US)

(72) Inventors: Bryon Western, West Fork, AR (US); John Fraley, Fayetteville, AR (US)

(73) Assignee: CREE FAYETTEVILLE, INC., Fayetteville, AR (US)

( * ) Notice: Subject to any disclaimer, the term of this patent is extended or adjusted under 35 U.S.C. 154(b) by 54 days.

(21) Appl. No.: 13/891,720

(22) Filed: May 10, 2013

(51) Int. Cl.
    *H05K 1/09* (2006.01)
(52) U.S. Cl.
    CPC ..................................... *H05K 1/09* (2013.01)
(58) Field of Classification Search
    CPC ........................................................ H05K 1/09
    USPC .................... 174/257, 250, 255, 256, 258
    See application file for complete search history.

(56) References Cited

U.S. PATENT DOCUMENTS

| | | | | |
|---|---|---|---|---|
| 6,541,859 B1 | 4/2003 | Forbes et al. | | 257/742 |
| 7,629,017 B2 | 12/2009 | Kodas et al. | | 427/58 |
| 7,691,664 B2 | 4/2010 | Kodas et al. | | 438/89 |
| 7,732,002 B2 | 6/2010 | Kodas et al. | | 427/58 |
| 8,043,536 B2 | 10/2011 | Inaba et al. | | 252/514 |
| 2001/0004477 A1* | 6/2001 | Fukunaga et al. | | 427/475 |
| 2007/0212564 A1* | 9/2007 | Sasaki et al. | | 428/570 |
| 2008/0179618 A1* | 7/2008 | Cheng | H01L 33/486 | 257/99 |
| 2009/0008142 A1* | 1/2009 | Shimizu | B32B 5/18 | 174/261 |
| 2009/0296310 A1* | 12/2009 | Chikara | H01G 2/065 | 361/301.4 |
| 2010/0055393 A1* | 3/2010 | Park et al. | | 428/137 |
| 2010/0104829 A1 | 4/2010 | Keusseyan | | 428/195.1 |
| 2013/0003375 A1* | 1/2013 | Hussell | | 362/249.02 |

* cited by examiner

*Primary Examiner* — Tremesha S Willis
(74) *Attorney, Agent, or Firm* — Baker Hostetler LLP

(57) ABSTRACT

A power substrate utilizing silver conductors on ceramic, and the process for making said device. The insulating portion of the substrate is fabricated from a ceramic by placing trenches into the ceramic which can be filled with silver conductors. These conductors can serve the purpose of traces for electrical interconnection, pads for die attachment, as well as thermal conductors for heat pipes and heat spreaders. The conductors can be made on both the top and the bottom of the ceramic. Such substrates may be used for a multitude of applications requiring power substrates for conducting large currents, and are suitable for high efficiency, high temperature, and/or high reliability applications.

21 Claims, 4 Drawing Sheets

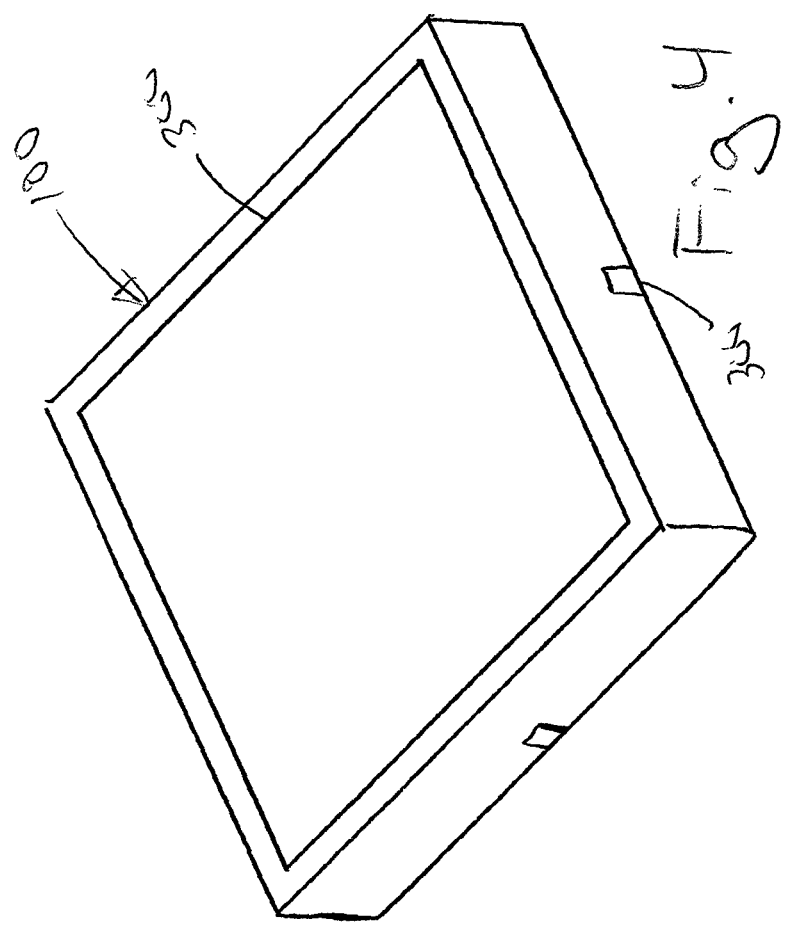

SILVER FILLED TRENCH SUBSTRATE FOR HIGH POWER AND/OR HIGH TEMPERATURE ELECTRONICS

CROSS-REFERENCE TO RELATED APPLICATIONS

This application claims priority of U.S. Patent Application 61/645,292, filed May 10, 2012 entitled SILVER FILLED TRENCH SUBSTRATE FOR HIGH POWER AND/OR HIGH TEMPERATURE ELECTRONICS, which is hereby incorporated by reference in its entirety.

STATEMENT REGARDING FEDERALLY SPONSORED RESEARCH OR DEVELOPMENT

Not Applicable.

REFERENCE TO A MICROFICHE APPENDIX

Not Applicable.

RESERVATION OF RIGHTS

A portion of the disclosure of this patent document contains material which is subject to intellectual property rights such as but not limited to copyright, trademark, and/or trade dress protection. The owner has no objection to the facsimile reproduction by anyone of the patent document or the patent disclosure as it appears in the Patent and Trademark Office patent files or records but otherwise reserves all rights whatsoever.

BACKGROUND OF THE INVENTION

1. Field of the Invention

The present invention is directed to the design of a power substrate utilizing silver conductors on ceramic, and the process for making the device.

2. Description of the Known Art

The role of a power substrate in power electronics applications is to provide both electrical interconnections between components and systems, as well as to dissipate large amounts of heat to cool the active electrical components. These substrates must be able to withstand both high temperatures, as well as thermal cycling. Common substrates used for power applications include direct bond copper (DBC), direct bond aluminum (DBA), and active metal braze (AMB), and the ceramic used commonly in these substrates are alumina, silicon nitride, aluminum nitride, and beryllium oxide.

Patents disclosing information relevant to electrical circuit and trace formation include: U.S. Pat. No. 8,043,536, issued to Inaba, et al., on Oct. 25, 2011 entitled Silverpalladium alloy containing conductor paste for ceramic substrate and electric circuit; U.S. Pat. No. 6,541,859, issued to Forbes, et al. on Apr. 1, 2003, entitled Methods and structures for silver interconnections in integrated circuits; U.S. Pat. No. 7,732,002 issued to Kodas, et al. on Jun. 8, 2010 entitled Method for the fabrication of conductive electronic features; U.S. Pat. No. 7,691,664 issued to Kodas, et al. on Apr. 6, 2010 entitled Low viscosity precursor compositions and methods for the deposition of conductive electronic features; and U.S. Pat. No. 7,629,017 issued to Kodas, et al. on Dec. 8, 2009 entitled Methods for the deposition of conductive electronic features. United States Patent Application No. 20100104829 A1, filed by KEUSSEYAN; ROUPEN LEON on Apr. 29, 2010 entitled PROCESS FOR THICK FILM CIRCUIT PATTERNING. Each of these references are hereby incorporated in their entirety.

The prior art teaches that silver will not adhere to the surface of a substrate such that one must use compositions that reduce the conductivity of the surface traces. The present invention teaches a direct contrast to the prior art by teaching a three dimensional trench traces of pure silver for high conductivity. The trench provides sufficient contact area for the necessary level of adhesion.

SUMMARY OF THE INVENTION

This invention describes the design of a power substrate utilizing silver conductors in ceramic, and the process for making said device. The insulating portion of the substrate is fabricated from a ceramic by placing trenches into the ceramic which can be filled with silver conductors. These conductors can serve the purpose of traces for electrical interconnection, pads for die attachment, as well as thermal conductors for heat pipes and heat spreaders. The conductors can be made on both the top and the bottom of the ceramic. Such substrates may be used for a multitude of applications requiring power substrates for conducting large currents, and are suitable for high efficiency, high temperature, and/or high reliability applications.

BRIEF DESCRIPTION OF THE SEVERAL VIEWS OF THE DRAWINGS

In the following drawings, which form a part of the specification and which are to be construed in conjunction therewith, and in which like reference numerals have been employed throughout wherever possible to indicate like parts in the various views:

FIG. 4 shows the low temperature co-fired ceramic substrate bottom with the deep trenches and deep cavities filled with silver.

DETAILED DESCRIPTION OF THE INVENTION

Figure 1:
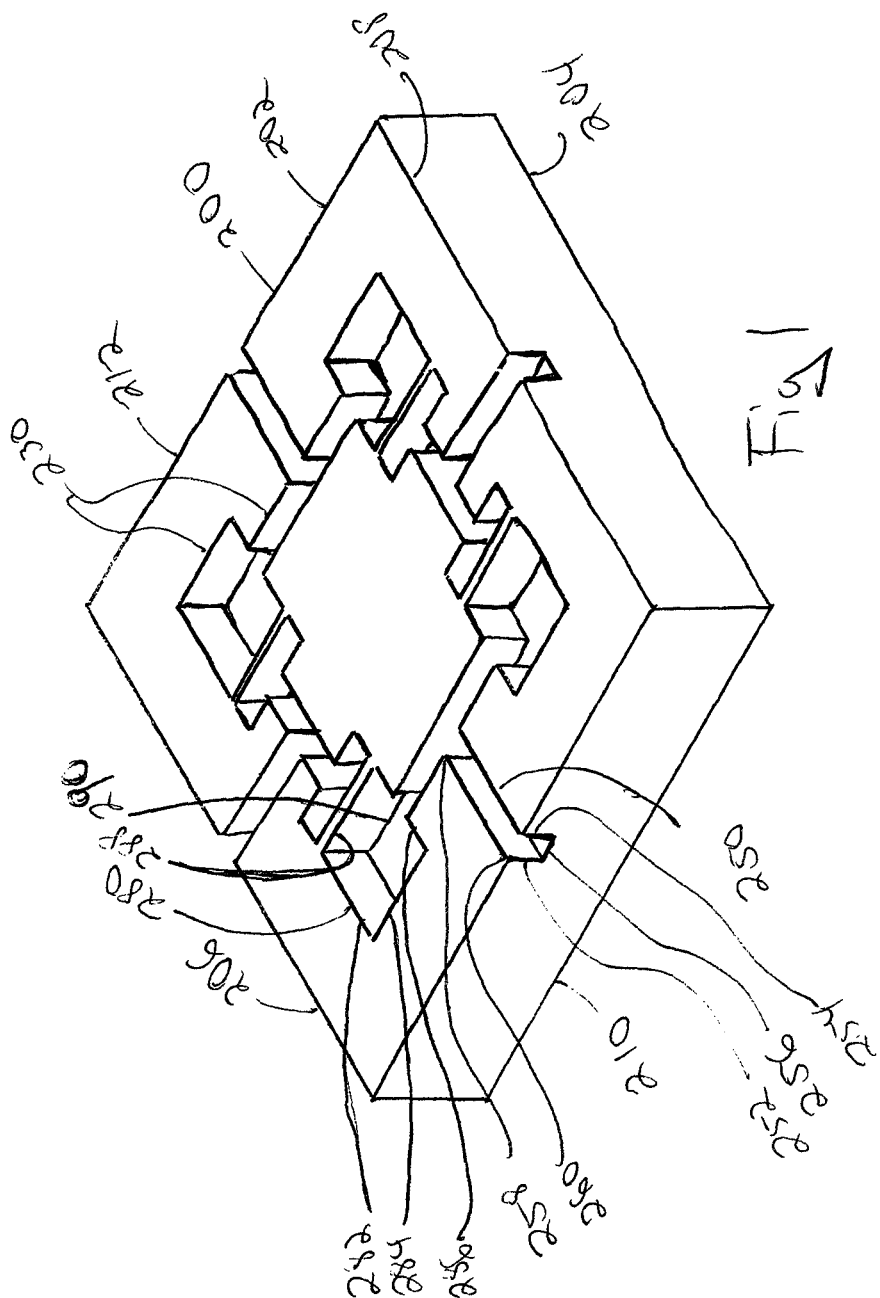
FIG. 1 shows a low temperature co-fired ceramic substrate top with deep trenches and deep cavities.
Figure 2:
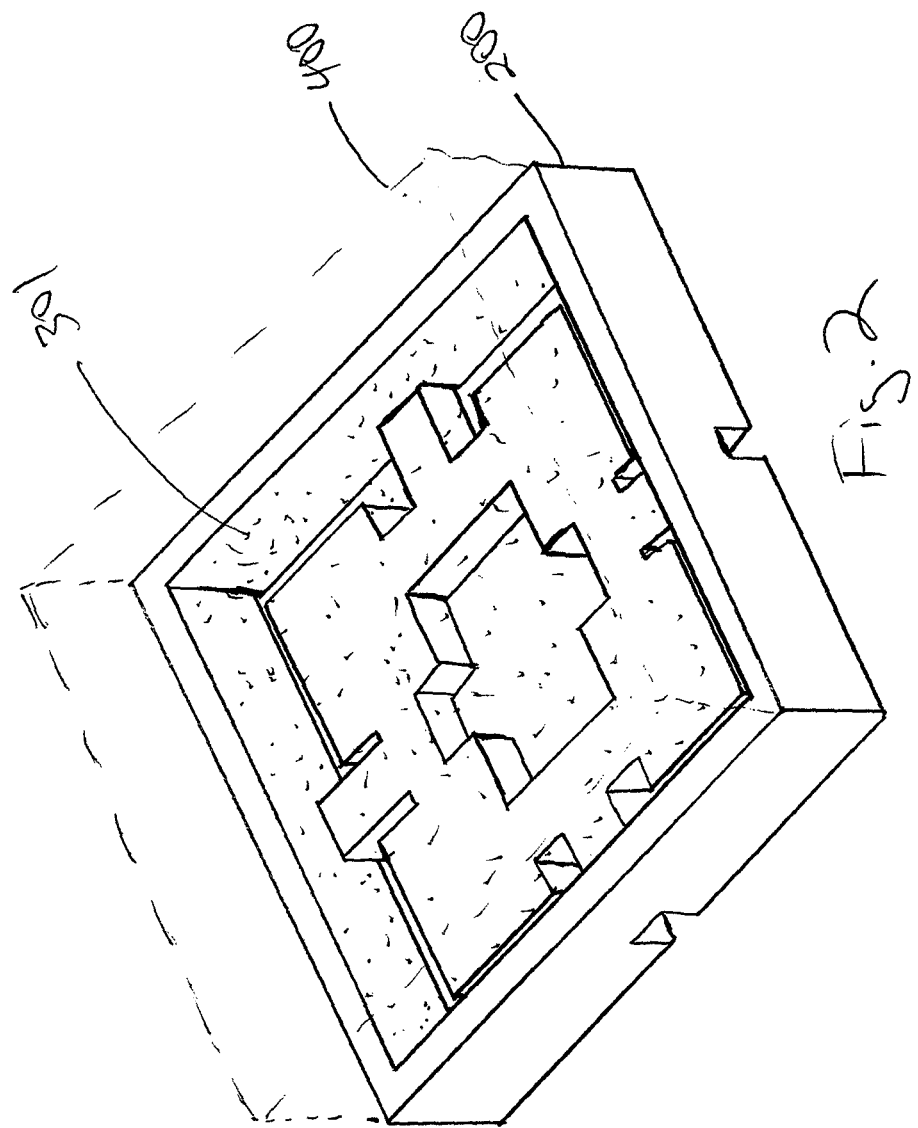
FIG. 2 shows a low temperature co-fired ceramic bottom with deep trenches and cavities.
Figure 3:
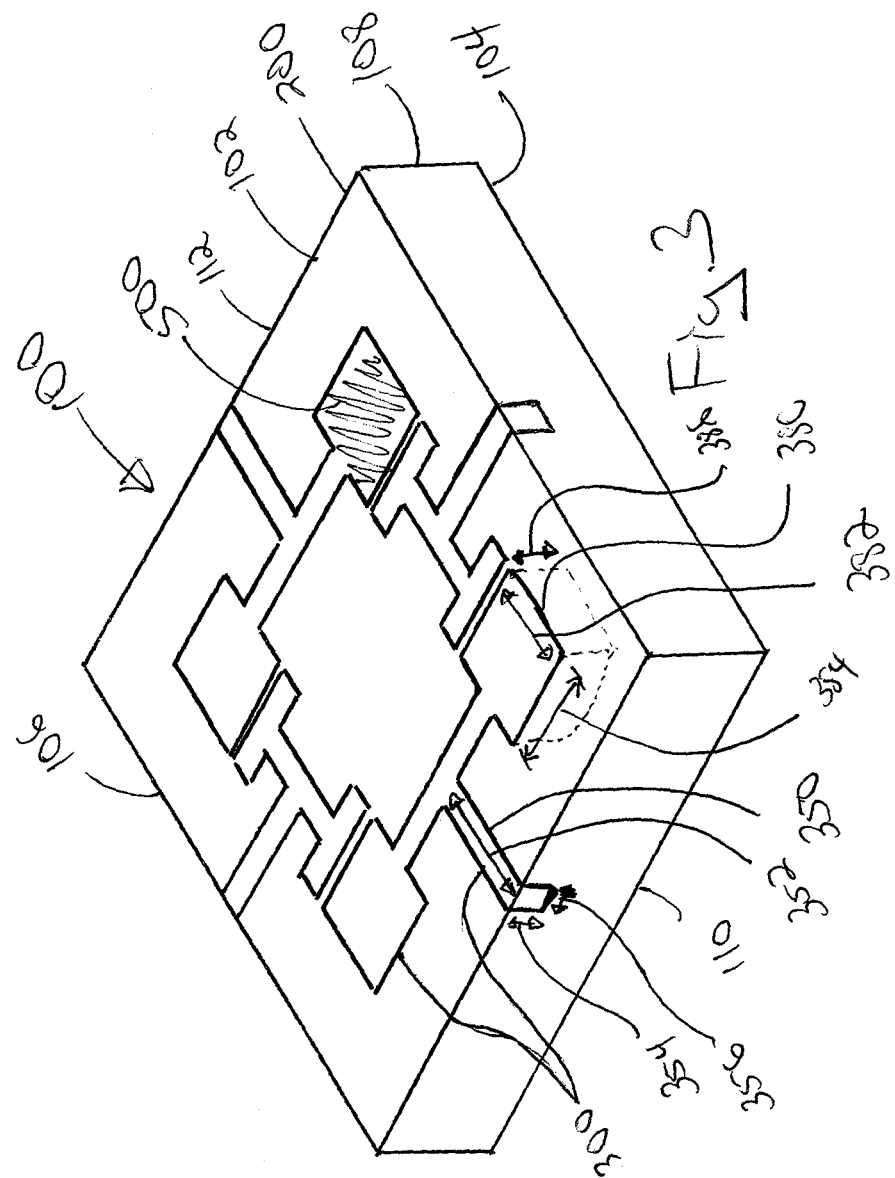
FIG. 3 shows the low temperature co-fired ceramic substrate top with the deep trenches and deep cavities filled with silver.

As shown in FIGS. 1 through 4 of the drawings, a filled substrate 100 begins with an ceramic insulating body 200 fabricated with deep trenches 250 and/or deep cavities 280 that are then filled with silver conductors 300. These conductors 300 can serve the purpose of deep traces 250 for electrical interconnection or deep cavities 280 for pads for die attachment, which can also be used as thermal conductors such as heat pipes and heat spreaders. As shown in the figures, these conductors 300 can be made on both the top 202 and the bottom 204 of the ceramic body 200. Such substrates 100 may be used for a multitude of applications requiring power substrates for conducting large currents, and are suitable for high efficiency, high temperature, and/or high reliability applications. An additional application is for the process is creating high temperature capable inductors for radio frequency applications. Because the inductor material can be made of thick, pure silver, a very high conductivity, and thus very high Q inductor can be used over a very wide temperature range. This is a key component in high temperature wireless devices.

In the embodiment shown, the filled substrate 100 is formed with a substrate top 102, substrate bottom 104, substrate left side 106, substrate right side 108, substrate front 110, and substrate back 112.

The ceramic insulating body 200 is formed with a body top 202, body bottom 204, body left side 206, body right side 208, body front 210 and body back 212. The ceramic body 200 is a ceramic structure, such as Alumina or other low temperature co-fired ceramic that allow for the formation of fillable apertures 230 such as deep trenches 250 or deep cavities 280.

The deep trenches 250 are formed with a first trench wall 252, second trench wall 254, and trench bottom 256, that define a first trench end 258, and a second trench end 260. Deep trenches 250 may connected to other deep trenches 250, surface traces not shown, or deep cavities 280.

The deep cavities 280 are formed with a first cavity wall 282, second cavity wall 284, third cavity wall 286, fourth cavity wall 288, and cavity bottom 290.

The silver conductors 300 are formed as trench traces 350 filling the deep trenches 250 having a trace length 352 stretching from the first trench end 258 to the second trench end 260 and having a trace depth 354 defined by the trench walls 252, 254 and a trace width 356 defined by the trench bottom 256. The silver conductors 300 are formed by means of high temperature silver reflow.

The cavity blocks 380 are formed having a block length 382, block width 384, and block depth 386.

From this embodiment it should also be considered that different shapes such as oval, triangular, or other shapes can be ulitized for the trench traces 350 and cavity blocks 380, limited only by the ability to form the ceramic body 200 and flow the silver to fill it.

The resulting substrate can be used for high power substrates in a number of high reliability or high temperature applications, such as aerospace, down hole, automotive, industrial processes and others For the forming process, a ceramic substrate body 200 is created in a fashion wherein the trenches 250 or cavities 280 are formed into the ceramic. Silver can then be reflowed into the trenches 250 or cavities 280 to form conductors 300 such as traces for electrical interconnection, die attachment, and thermal conduction. There are several different ways to form the ceramic body 200 with the necessary structures. In the case of bulk alumina or other ceramic substrate, trenches can be cut into the ceramic by means of water jet or laser milling, or through dry or wet etching processes. In the case of multilayer substrates, such as low temperature co-fired ceramics also commonly known as LTCC, the appropriate structures can be punched out of the unfired ceramic, and then stacked, laminated and fired to provide the necessary structures. Both of these processes have been prototyped with success. Additionally, these structures may be placed on the top, bottom, sides, and internal to the ceramic substrate body 200 to form any desired shape or interconnection desired both in two and three dimensional forms.

Once the necessary ceramic base 200 has been formed, silver is reflowed into the trenches 250 and or cavities 280. This is done by filling said trenches and cavities with silver powder 301, and then placing a cap 400 over the trenches that will withstand the melting temperature of the silver. The cap 400 is also chosen such that it will not stick to either the ceramic substrate or the silver. This cap 400 prevents the silver from beading up within the structures, and keeping the silver uniform throughout the structure. Once the silver has melted and flowed into the ceramic structures 250, 280, the entire substrate 100 is cooled to room temperature. The appropriate surface 102, 104, 106, 108, 110, 112 of the substrate 100 is then polished smooth. The conductors 300 can then be plated with metals to prevent diffusion and electromigration of the silver. Such plating conductors 500 may be nickel, platinum, palladium, and gold in different combinations.

This process differs from other substrate manufacturing processes in that the conductor is pure, or nearly pure, silver, as opposed to copper, aluminum, or silver/copper alloys, as well as in the three-dimensional structure of the ceramic substrate. By creating deep trenches within the ceramic, very high conductivity traces may be created that take up less surface area, allowing for smaller, more power-dense substrates. Additionally, by creating thick thermal heat spreaders and heat pipes out of pure silver, a superior thermal performance can be obtained on the substrate.

The direct bond silver substrate described in this invention was discovered accidentally in the laboratory, when subjecting silver and low temperature co-fired ceramic, LTCC, simultaneously to temperatures >960° C., above the melting temperature of silver, in an open air environment in order to attach 99.9% pure silver inductors to the LTCC substrate. The silver and LTCC formed a very strong bond between them, with no flux or alloys needed in the process. Further experiments showed good bonding between silver and both LTCC and alumina substrates.

Reference numbers used throughout the application are as follows:
filled substrate 100
substrate top 102
substrate bottom 104
substrate left side 106
substrate right side 108
substrate front 110
substrate back 112
ceramic insulating body 200
body top 202
body bottom 204
body left side 206
body right side 208
body front 210
body back 212
fillable apertures 230
deep trenches 250
first trench wall 252
second trench wall 254
trench bottom 256
first trench end 258
second trench end 260
deep cavities 280
first cavity wall 282
second cavity wall 284
third cavity wall 286
fourth cavity wall 288
cavity bottom 290
silver conductors 300
silver powder 301
trench traces 350
trace length 352
trace depth 354
trace width 356
cavity blocks 380
block length 382
block width 384 block depth 386
cap 400
plating conductor 500

From the foregoing, it will be seen that this invention well adapted to obtain all the ends and objects herein set forth, together with other advantages which are inherent to the structure. It will also be understood that certain features and subcombinations are of utility and may be employed without reference to other features and subcombinations. This is contemplated by and is within the scope of the claims. Many possible embodiments may be made of the invention without departing from the scope thereof. Therefore, it is to be understood that all matter herein set forth or shown in the accompanying drawings is to be interpreted as illustrative and not in a limiting sense.

When interpreting the claims of this application, method claims may be recognized by the explicit use of the word 'method' in the preamble of the claims and the use of the 'ing' tense of the active word. Method claims should not be interpreted to have particular steps in a particular order unless the claim element specifically refers to a previous element, a previous action, or the result of a previous action. Apparatus claims may be recognized by the use of the word 'apparatus' in the preamble of the claim and should not be interpreted to have 'means plus function language' unless the word 'means' is specifically used in the claim element. The words 'defining,' 'having,' or 'including' should be interpreted as open ended claim language that allows additional elements or structures. Finally, where the claims recite "a" or "a first" element of the equivalent thereof, such claims should be understood to include incorporation of one or more such elements, neither requiring nor excluding two or more such elements.

What is claimed is:

1. A filled substrate apparatus, comprising:
   a low temperature co-fired ceramic insulating body defining fillable apertures partially extending through the ceramic insulating body, the fillable apertures having a length and a width defined by a plurality of ceramic walls, and the fillable apertures having a depth defined by a bottom ceramic surface; and
   silver conductors plated with a plating conductor having a material different from the silver conductors, the silver conductors being positioned in contact with the low temperature co-fired ceramic insulating body in the fillable apertures, the silver conductors having a uniform cross section of substantially pure silver.

2. The apparatus of claim 1, wherein the fillable apertures comprise: deep trenches.

3. The apparatus of claim 1, wherein the fillable apertures comprise: deep cavities.

4. The apparatus of claim 1, wherein the ceramic insulating body is formed from an alumina substrate.

5. A method for forming a filled substrate apparatus, the method comprising:
   providing a ceramic substrate with an aperture partially extending through the ceramic substrate, the aperture having a length and a width defined by a plurality of ceramic walls of the ceramic substrate, and the aperture having a depth defined by a bottom ceramic surface of the ceramic substrate;
   filling the aperture only with substantially pure silver powder;
   placing an inert cap over the substantially pure silver powder in the aperture;
   melting the substantially pure silver powder to form a substantially pure silver conductor; and
   plating the substantially pure silver conductor with a material different from the substantially pure silver conductor.

6. The method of claim 5, wherein providing the ceramic substrate with the aperture comprises providing deep trenches.

7. The method of claim 5, wherein providing the ceramic substrate with the aperture comprises providing deep cavities.

8. The method of claim 5, wherein providing the ceramic substrate further comprises forming the ceramic substrate from a low temperature co-fired ceramic.

9. The method of claim 5, wherein providing the ceramic substrate further comprises forming the ceramic substrate from an alumina substrate and wherein the material different from the substantially pure silver conductor comprises one of the following: nickel, platinum, palladium, gold, and combinations thereof.

10. The method of claim 5, further comprising forming the aperture partially extending through the ceramic substrate utilizing at least one of the following:
    forming the aperture with a waterjet process;
    forming the aperture with a laser milling process;
    forming the aperture with a dry etching process; and
    forming the aperture with a wet etching process.

11. The method of claim 5, further comprising forming the aperture partially extending through the ceramic substrate, wherein forming the aperture comprises punching out the aperture in an unfired ceramic substrate.

12. The method of claim 5, further comprising polishing at least one surface of the following: the ceramic substrate, the substantially pure silver conductor, or the material different from the substantially pure silver conductor.

13. The apparatus of claim 1, wherein the plating conductor comprises one of the following: nickel, platinum, palladium, gold, and combinations thereof.

14. The apparatus of claim 1, wherein:
    the fillable apertures are arranged on a top surface of the ceramic insulating body;
    the ceramic insulating body further defining additional fillable apertures partially extending through a bottom side of the ceramic insulating body, the additional fillable apertures having a length and a width defined by a plurality of ceramic walls, and the fillable apertures having a depth defined by a ceramic surface; and
    silver conductors plated with a plating conductor and positioned in contact with the ceramic insulating body in the additional fillable apertures, the silver conductors having a uniform cross section of substantially pure silver.

15. The apparatus of claim 1, wherein the fillable apertures comprise a rectangular shape.

16. The apparatus of claim 1, wherein the fillable apertures are formed on both sides of the insulating body.

17. A filled substrate apparatus, comprising:
    a ceramic insulating body defining fillable apertures partially extending through the ceramic insulating body, the fillable apertures having a length and a width defined by a plurality of ceramic walls, and the fillable apertures having a depth defined by a bottom ceramic surface; and
    silver conductors plated with a plating conductor having a material different from the silver conductors, the silver conductors positioned in contact with the ceramic insulating body in the fillable apertures, and the silver conductors having a uniform cross section of substantially pure silver, wherein the fillable apertures are located and arranged in both sides of the insulating body.

18. The apparatus of claim 17, wherein the plating conductor comprises one of the following: nickel, platinum, palladium, gold, and combinations thereof; and
wherein the ceramic insulating body is formed from an alumina substrate.

19. The apparatus of claim 17, wherein the ceramic insulating body is formed from a low temperature co-fired ceramic.

20. The apparatus of claim 17, wherein the ceramic insulating body is formed from alumina substrate, and wherein the fillable apertures comprise: deep cavities.

21. The apparatus of claim 1, wherein the material different from the silver conductors comprises one of the following: nickel, platinum, palladium, gold, and combinations thereof.

* * * * *